United States Patent
Zhang et al.

(10) Patent No.: US 8,274,200 B2
(45) Date of Patent: Sep. 25, 2012

(54) MICROFABRICATED CANTILEVER SLIDER WITH ASYMMETRIC SPRING CONSTANT

(75) Inventors: Huantong Zhang, Long Beach, CA (US); Daniel Hyman, Long Beach, CA (US)

(73) Assignee: XCOM Wireless, Inc., Signal Hill, CA (US)

( * ) Notice: Subject to any disclaimer, the term of this patent is extended or adjusted under 35 U.S.C. 154(b) by 846 days.

(21) Appl. No.: 12/274,312

(22) Filed: Nov. 19, 2008

(65) Prior Publication Data
US 2009/0127082 A1 May 21, 2009

Related U.S. Application Data

(60) Provisional application No. 60/989,079, filed on Nov. 19, 2007.

(51) Int. Cl.
*H01L 41/08* (2006.01)

(52) U.S. Cl. ......... 310/330; 310/331; 310/332; 200/181

(58) Field of Classification Search .......... 310/330–332, 310/328; 200/181
See application file for complete search history.

(56) References Cited

U.S. PATENT DOCUMENTS

| | | | | |
|---|---|---|---|---|
| 4,959,515 A | * | 9/1990 | Zavracky et al. | 200/181 |
| 5,258,591 A | * | 11/1993 | Buck | 200/181 |
| 5,638,946 A | * | 6/1997 | Zavracky | 200/181 |
| 6,046,659 A | * | 4/2000 | Loo et al. | 333/262 |
| 6,331,257 B1 | * | 12/2001 | Loo et al. | 216/13 |
| 6,504,118 B2 | | 1/2003 | Hyman et al. | |
| 6,667,245 B2 | * | 12/2003 | Chow et al. | 438/723 |
| 6,777,629 B2 | * | 8/2004 | Lane et al. | 200/181 |
| 6,803,559 B2 | * | 10/2004 | Hsu et al. | 250/227.22 |
| 6,872,902 B2 | * | 3/2005 | Cohn et al. | 200/181 |
| 7,022,542 B2 | * | 4/2006 | Combi et al. | 438/52 |
| 7,053,737 B2 | * | 5/2006 | Schwartz et al. | 335/78 |
| 7,101,724 B2 | * | 9/2006 | Chou | 438/48 |
| 7,215,064 B2 | * | 5/2007 | Mehta | 310/331 |
| 7,345,404 B2 | * | 3/2008 | Klee et al. | 310/330 |
| 7,358,579 B2 | * | 4/2008 | Ma et al. | 257/415 |
| 7,372,191 B2 | * | 5/2008 | Ohmori et al. | 310/330 |
| 7,385,744 B2 | * | 6/2008 | Kogut et al. | 359/198.1 |
| 7,675,393 B2 | * | 3/2010 | Kawakubo et al. | 335/78 |
| 7,772,745 B2 | * | 8/2010 | Kawakubo et al. | 310/330 |
| 7,830,066 B2 | * | 11/2010 | Liu | 310/309 |
| 2005/0184836 A1 | | 8/2005 | Chou | |
| 2009/0085432 A1 | * | 4/2009 | Liu | 310/317 |

FOREIGN PATENT DOCUMENTS

WO   WO2004/015729   2/2004

* cited by examiner

*Primary Examiner* — Jaydi San Martin
(74) *Attorney, Agent, or Firm* — Mintz, Levin, Cohn, Ferris, Glovsky and Popeo, P.C.

(57) ABSTRACT

Mechanical springs and sliders as used in microfabricated actuators to provide an asymmetric spring constant are described. The asymmetric spring constant provides a propensity for deflection towards one direction, and a propensity for separation (i.e. restoration) towards the other direction. The asymmetry and slider system provides a passive mechanical means to achieve faster switching times and higher switch restoring forces.

11 Claims, 4 Drawing Sheets

MICROFABRICATED CANTILEVER SLIDER WITH ASYMMETRIC SPRING CONSTANT

CROSS REFERENCE TO RELATED APPLICATIONS

The present application claims priority under 35 U.S.C. §119 to U.S. Provisional Application Ser. No. 60/989,079, filed Nov. 19, 2007, entitled "MICROFABRICATED CANTILEVER SLIDER WITH ASYMMETRIC SPRING CONSTANT", the disclosure of which is incorporated herein by reference.

TECHNICAL FIELD

The subject matter described herein relates in general to mechanical devices, and, more specifically, to microfabricated electromechanical systems devices used as sensors and/or actuators.

BACKGROUND

The following terms used in this patent document have generally accepted meanings in engineering literature and will not be specifically defined herein: resistance, component, circuit, electrons and electronic, capacitor and capacitive, control, signal, voltage, current, power, energy, frequency, radio-frequency (RF), sensor, actuator and actuation, electrostatic, electromagnetic, piezoelectric, electromechanical, thermomechanical, all terms of the S.I. and English unit systems, and all materials used in science and industry.

Other terms have meanings in the context of this document that will be made clear. The description of the drawings and detailed description portions of this document include some of these precise terms that describe numbered elements of the drawings as they occur in the text. For the purposes of this patent document, the following terms are now defined:

An actuation is defined as the action of opening or closing a relay or other switching device. An actuator is defined as the energy conversion mechanism responsible for actuation.

An armature is defined as an element that is deflected or moved by an actuator in order to move from one state to another state in a device with multiple stable states.

A µm, micron, or micrometer is a unit of length equal to one-one-thousandth of a millimeter.

Microfabrication is a fabrication method of defining components delineated through photolithographic techniques made popular by the integrated circuit developer community.

Micromachining is the action of delineating a microfabricated element that has been photolithographically defined, often performed by an etching process using acids or bases or by physical means such as ion milling or photoresist lift-off techniques.

MEMS and MEMS devices are Microfabricated Electro-Mechanical Systems, which denotes a manufacturing technology that uses microfabrication techniques to develop miniaturized mechanical, electromechanical, and thermomechanical components. MEMS devices in this context include contact devices, which include a subset of physical and electrical contact devices such as switches, relays, and switchable capacitors.

Many MEMS devices based on cantilevers been incorporated into a wide variety of devices used in everyday life such as airbag accelerometers, disk drives, and chemical sensors. A staggering variety of various cantilever manufacturing processes, technologies, and architectures have been employed in the literature and in products throughout the past 20 years, with most of these devices having low forces available for actuation and restoration.

Certain switching devices have multiple stable states, and are typically driven by control signals to cause them to assume a particular one of the possible stable states. In most devices of this type, one state is a passive state, which is its "natural" condition when no control signals are applied. When an active state is desired, a drive control signal is applied to an actuator(s), which deflects an armature(s) until mechanical limitations prevent further deflection. Once configured into a second state, it may be desirable to hold the switching device in its second state for a period of time using either passive or active latching technologies. In many contact devices, removal of the latching control signal or condition can then send the switching device back to its passive state.

Conventional MEMS contact devices can encounter a problem during the restoration part of the operating cycle described previously, as there can be forces in place during contact that are sufficient to overpower the restoring forces available from the deflected armature. Many commonly configured cantilever devices stick to its lower substrate when it was supposed to be free. This problem arises due to a variety of surface effects such as metallic cold welding, solid bridging, Van der Waal's forces, capillary forces, etc., and was dubbed the non-technical moniker "stiction" early in the MEMS industry.

Engineering around the adhesion problem by selecting careful geometries and materials is difficult for typical cantilever switch architectures, as the spring strength of the cantilever itself becomes the limiting factor. A strong spring, such as that with a spring constant (k) larger than 10 N/m (relative strength being depending on the device geometry and operation), can be designed to break a switch contact, or pull the cantilever away from surface bonding effects. A strong spring is also harder to move in the first place, however, which means larger forces are required to move it. Increasing the available forces and motive power available from the actuation mechanism is the first engineering solution to the problem of using a stronger spring, but limitations of available voltage, current, or size quickly challenges the designer.

Conventional techniques for addressing adhesion issues focus on altering the physical chemistry or surface effects of micro-scale mating surfaces, or by reducing the physical surface area available for these nano-scale forces to operate upon.

Although the problem of undesirable surface adhesion from manufacturing and during operation has been addressed in a number of ways, the problem of MEMS cantilevers sticking to other surfaces is still commonly seen as a regular yield factor or operational failure mechanism in industry. The additional complexity of many of the solutions discussed adds additional cost. The operational adhesion problems are particularly relevant for MEMS devices that are supposed to stick to another surface in one state, and are supposed to release from that surface in another state. This is most commonly seen in switching devices such as MEMS switches and relays, which make and break Ohmic or capacitive contact between load signal electrodes during operation.

Some MEMS arrangements incorporate active solutions to the problem of devices that are stuck to the other surface. One typical example is to provide for a drive electrode on the opposing face of a typical electrostatically-actuated device, so that a cantilever can be actuated closed and also actuated open from the opposite side. This provides increased speed and force as compared to the passive restoring forces of deflected springs more typically found in MEMS devices.

An equivalent solution is very commonly used across the range of actuation types, including electrostatic, electromagnetic, thermal, and piezoelectric devices. The design penalty for multi-actuator device architectures can be significant, however, in terms of increased complexity of manufacture and operation, increased cost due to complexity and yield, and engineering limitations due to processing compatibility constraints. For electromagnetic and thermal actuation mechanisms, another penalty is increased power consumption, as these require power to operate both closed and open, instead of using power only in one direction and using passive restoring springs for the other.

None of the conventional solutions is optimal for MEMS devices that are simple to manufacture, make surface contact as part of their normal operation or environmental tolerance requirements, and require a high restoring force through passive operation.

SUMMARY

In a first aspect, a cantilever armature system includes a base, a primary actuator armature coupled to the base, and at least one spring element coupled to the primary actuator. The primary actuator armature and at least one spring element provide a first instantaneous spring constant in a first state in which at least one spring element does not contact the base, and they provide a second instantaneous spring constant in a second state in which at least one spring element contacts the base.

The primary actuator armature can be coupled to the base by an anchor region. The anchor region can be coupled to a cover substrate, the cover substrate being connected to the base.

A base contact element can be mounted on a face of the base opposing the primary actuator armature and an armature actuator element opposite the base contact element mounted on the primary actuator armature so that the armature contact element contacts the base contact element when the primary actuator armature is deflected.

A base actuator element can be mounted on a face of the base opposing the primary actuator armature and an armature contact element opposite the base actuator element mounted on one of the spring elements so that the armature actuator element contacts the base contact element when one of the spring elements is deflected.

One of the at least one spring elements can comprise an armature contact region on which the armature contact element is mounted.

A base slider element can be mounted on a face of the base opposing the primary actuator and an armature element opposite the base slider element mounted on one of the spring elements so that the armature element contacts the base slider element when the spring element is deflected.

One of the spring elements can comprise an armature slider region to which the armature element is mounted. The armature slider region can be coupled to an armature slider beam, the armature slider beam being coupled to an armature contact region, the armature contact region being coupled to the primary actuator armature.

In a further interrelated aspect, a cantilever armature system includes a base, a primary actuator armature and first and second spring elements. The primary actuator armature has a proximal end extending to a distal end along a primary axis, the proximal end of the primary actuator armature being coupled to the base. The first and second spring elements are mounted to the distal end of the primary actuator armature and extend perpendicular to the primary axis of the primary actuator armature. In addition, each of the primary actuator armature, the first spring element, and the second spring element comprising upper contact elements, the base comprising lower contact elements opposite the upper contact elements, the primary actuator armature, the first spring element and the second spring element that provide varying spring constants based on which of the upper contact elements are in contact with the lower contact elements.

In a further interrelated aspect, an apparatus includes a base and a microfabricated actuator armature coupled to the base. The actuator armature has an asymmetric spring constant providing a propensity for deflection towards the base and a propensity for separation away from the base.

The subject matter described herein provides a spring constant when initiating a reconfiguration of a MEMS device from a first state into a second state, and a different spring constant when initiating reconfiguration from the second state back to the first state or to a third state. This enables a physically-contacting MEMS device to have a much greater restoring (e.g., opening) spring strength than actuating (e.g., closing) spring strength in a typical configuration. The subject matter described herein also enables a changing spring constant that increases as the device moves from one state towards the second state. This enables the design of an engineering balance for actuation mechanisms that change in available motive power or force throughout the process of actuation (e.g., electrostatic actuators) so that the spring constant increases as the available actuator force increases, and decreases when the available actuator force decreases.

Devices are provided that require no intrinsic power consumption, as well as no significant added complexity in terms of operation or drive electronics. Unlike the conventional devices providing similar performance, advantageous architectures and placement of actuators and contacting regions can be utilized. This difference is critical in situations where electromechanical or thermomechanical actuator control signals must be kept physically separate from the function of the contacting region, such as in a relay.

The subject matter described herein is directed to a new type of MEMS physically contacting device, and are particularly directed towards improving switching devices of all types, including switches, relays, trip switches, contact sensors, switchable capacitors, and multi-state capacitors. These types of devices benefit greatly through improved operation in and between different stable states for the device.

The subject matter described herein provides a solution to these engineering limitations by employing a more complex passive restoring spring system. Instead of a single spring or set of springs defining the electromechanical response of the cantilever device, the cantilever has multiple springs available that work differently in different directions. This provides an asymmetry to the operation of the device so that the actuator faces a weaker spring system when it is weak, and faces a strong spring system when it is strongest.

BRIEF DESCRIPTION OF THE DRAWINGS

The figures are plan-views and cross-sectional views of cantilever devices. Objects are defined using cross-hatching, succinct black borders, and numeration. All objects shown in white or light cross-hatching represent elements that are typically manufactured of electrically insulating materials. Objects shown in dark cross-hatched patterns represent elements that are typically electrical conductors. The cross-hatched patterns for all visible elements are shown in the plan-view illustrations of FIGS. 1, 4, and 6 for the sake of clarity and continuity. Semiconductor materials may be used in alternative variations to manufacture the described insulators and/or conductors depending on the doping level of the semiconductor

FIG. 3A is the armature structure in the passive state.

FIG. 3B illustrates a curvature and reaction force induced in the armature structure as it begins to be driven by the actuator.

FIG. 3C illustrates the armature structure after the slider makes contact and the asymmetrical spring constant takes effect.

FIG. 3D illustrates the curvatures and reaction forces induced in the armature structure when in the fully deflected (actuated and/or latched) state.

FIG. 3E illustrates the curvatures and available restoring forces in the armature structure when the actuator and/or latching forces are removed.

DETAILED DESCRIPTION

Figure 1:
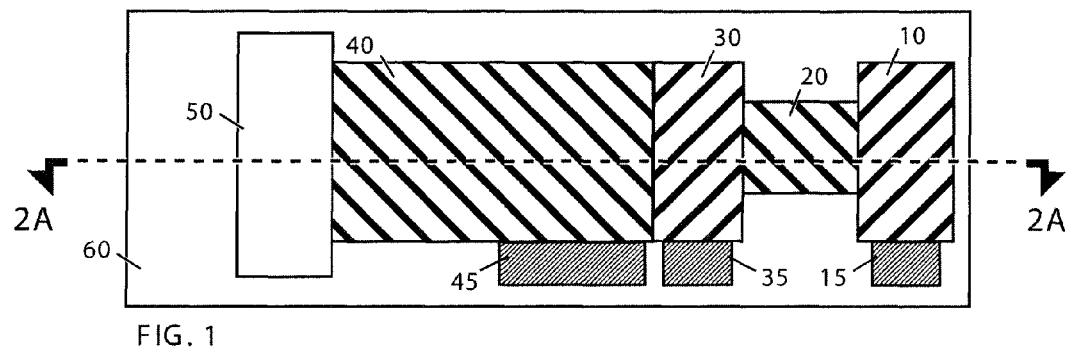
FIG. 1 is a functional plan-view illustration of one variation with cross-sectional lines and views provided for clarity. Relevant objects that are buried below the top surface are not visible, but can be seen in the cross-sectional schematic of FIG. 2A.

The subject matter described herein provides a new type of contacting device that incorporates the functional combination of one or more cantilever spring elements defining the overall spring constant of the device at the start of one direction of actuation, and uses a different combination of spring elements defining the overall spring constant at the start of a second direction. The second direction of motion can be due to either a purely passive response with the enhanced spring constant, or have actuation that can be improved by the enhanced spring constant. This combination of elements enables the use of low-force actuators with high speed that need to overcome a small spring constant when starting actuation, while in the same device provides a high spring constant to have a strong restoring force to separate elements of the device that have contacted and may be adhered due to one or more adhesion forces. The following description first discusses this functional combination of actuator technologies, then continues with a discussion of several variations that can be employed depending on the desired configuration.

A contacting MEMS device is a MEMS device with the added characteristic of having one element of the device that makes physical contact to another element. A variety of adhesive forces can then be present to keep the two elements in contact and resist attempts to separate them. One example of such a device is a relay, which has a load signal electrode suspended over a second load signal electrode. When control signals are actuated, the load signal electrodes come together, and touch, making both physical and electrical contact. Such a device enables the switching of load signals without interference from control signals. This also protects control electronics in applications where the load signal might be dangerous in some form; a high voltage or high current load signal might overload the control electronics if allowed to interact with the control signal paths. Radio-frequency devices often require high isolation of the control electronics from the signal loads, as RF power cannot be perfectly contained due to capacitive or inductive coupling. Most single-throw relays have two stable operational states defining whether the load signal circuit is either 1) open or 2) closed. Such a device forms a valuable component in a wide variety of applications in direct current, low frequency, and radio frequency applications, and the many efforts to create microfabricated versions of relays attest to the industry interest.

Multimorph actuation mechanisms can be used to generate very high forces (mN to N contact forces) at moderate speeds (μsec to msec actuation times) over moderate distances (several μm to mm of armature deflection) with moderate power requirements (tens of μW to tens of mW for continuous operation). In particular, multimorph actuator technology can be employed to generate moderate contact forces in order to reliably make electrical load signal contacts. Some technologies require constant power to maintain, for example, whereas others demonstrate weakening, unreliability, or failure if an actuator drive signal or relay state is maintained for an extended period of time (seconds to years). Multimorph actuator technologies are also complex to design because of the use of dissimilar materials. As a result of this complexity, it can be desirable to use a multimorph actuator to actuate a MEMS device in only one direction (i.e., either open or closed) if possible. If a multimorph actuator is used only to close a MEMS contact device, then a strong restoring force (hundreds of μN to tens of mN) may be needed to subsequently open it.

In order to circumvent the undesirable attributes of multimorph actuation mechanisms, a low-power, non-destructive alternative can be utilized. Electrostatic actuation has long been a core technology in the microfabricated actuator community for very low power consumption (aW to μW) and fast closure times (10 nsec to 500 μsec). The forces (1 μN to 0.5 mN) and actuator travel distances (one to ten μm) typical for these devices are very limited, however, and most electrostatic contact devices suffer accordingly in terms of contact force, reliability, isolation, and standoff voltage. A key advantage of electrostatic actuation mechanisms that is largely unused by industry is the fact that the actuation force increases dramatically as the actuator traverses and deflects towards the closed, contacted state. This critical advantage couples well with the subject matter described herein, as the asymmetric spring constant can increase as the device gets closer together. When properly designed, the increase in closure force available from the actuator will overcome the increase in restoring spring strength, and the strong, loaded spring will be ready and available to separate the contact when needed.

The present devices are advantageous compared to prior microfabricated contacting devices because multiple combinations of springs are combined to utilize the advantages of each and mitigate the disadvantages of the selected actuation technologies of the device. One or more multimorph or electrostatic actuators can be used to drive the device into a contacted state, with the majority of the work required to attain the state performed by the comparably powerful actuation technologies during the last part of the closure operation. In such a combination, the advantages of the actuation mechanisms are realized, with their disadvantages mitigated Microfabricated contacting devices with overall planar dimensions of total width and length between 5 μm and 5 mm can be provided. The planar dimensions selected for a particular design would be primarily dependent on the required speed and the type of signal load (if any) carried by the contacting elements. Devices requiring faster switching times less than 10 μs might be designed at the low end of size ranges given, whereas devices carrying higher signal loads higher than 30 A or 200 W might have sizes near the high end of the ranges recommended. There is a large amount of engineering flexibility in these values, as designs using different actuation mechanisms can vary considerably.

A device as described herein can handle low to moderate signal loads (between 20 μA and 5 A or 0.1 mW and 50 W as a maximum rated load) and moderate to fast switching speeds (between 1 μs and 100 μs), and may have planar dimensions of between 20 μm and 1 mm. Such dimensions might be appropriate for applications in consumer wireless communications, enterprise broadband communications, tactical military communications, or general telecommunications and light industrial switching applications. In applications where high or very high signal load switching is required and slower speeds are acceptable, such as general purpose industrial relays or high power RF systems, the overall planar dimensions for devices can be, for example, between 0.2 and 10 mm. For applications carrying light or very light (or zero) signal loads, or requiring high speeds, such as short-range wireless communicators, satellite receiver electronics, sensors, or some test equipment, might demand devices can have, for example, planar dimensions between 2 and 200 μm. Each of these ranges of overall planar contacting device length and width can be considered reasonable to expect in the application of this subject matter described herein. It is further recognized that applications demanding opposing requirements of faster actuation speeds and higher signal loads or shock resistance for the same device may require that the device be designed with planar dimensions anywhere in the ranges suggested.

Throughout the detailed description, possible materials and sizes for elements have been suggested for applications defining a particular signal load or switching speed. It may be considered instructive to examine one variation of material and geometry selection for one application envisioned for this subject matter described herein. Consider an application with low signal loads that allows for fast actuation speeds, such that a first variation represents one possible design in the application of this subject matter described herein, with a plurality of variations illustrated in FIGS. 1, 2A, 2B 3A, 3B, 3C, 3D, and 3F.

FIG. 1 is a functional plan-view schematic of a device in which a cantilever armature system can be fixed at a common end and free to deflect at the opposing end. The first cantilever provides the majority of the defining spring characteristics for the device at the beginning of actuation, and can be called the primary armature. Additional cantilevers are mechanically coupled to, and suspended from, the primary armature to suspend other objects of the subject matter described herein and provide the majority of the defining spring characteristics for the device at the end of actuation. FIG. 1 is a true plan-view schematic, as elements such as electrical connections and electrodes are buried within the device and not depicted until viewed with the cross-sectional schematic of FIG. 2A. Objects are shown with consistent cross-hatching even in plan-view for clarity.

Figure 2A:
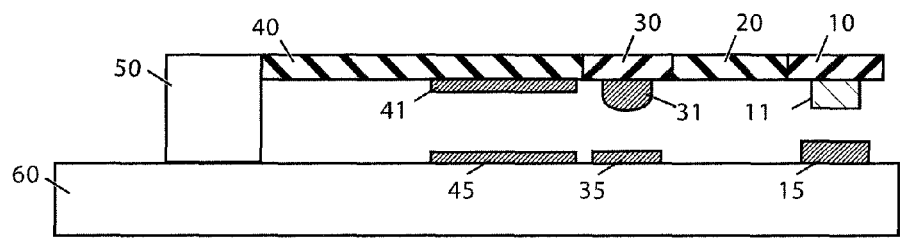
FIG. 2A is a cross-sectional schematic illustrating the armature structure of FIG. 1 when in the passive state.
Figure 2B:
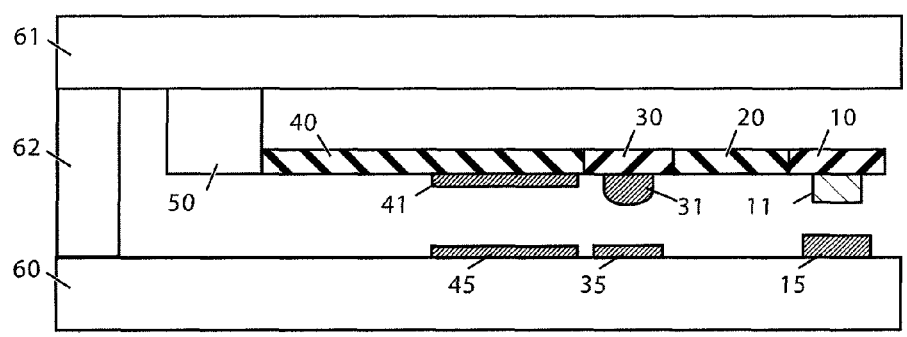
FIG. 2B is a cross-sectional schematic illustrating the armature structure of FIG. 1 in an alternative variation, shown in the passive state.

The first cross-section shown along with FIG. 1 is FIG. 2A, which illustrates a cross-sectional schematic of this device. A more complex switching device cross-section is illustrated in FIG. 2B, which illustrates an alternative configuration of a device represented by FIG. 1. A more complex version of these is further shown in FIGS. 3A through 3E, which illustrates actuation being performed. The advantages provided by the present subject matter are illustrated by examining the forces present in FIGS. 3A through 3E and how they change throughout operation from one state (open) into the other (closed).

The functionality of the armature system, and how each element of the armature system is responsible for suspension of actuator elements, contact elements, and for generating the asymmetric spring constant as the device is actuated is described below. It may be instructive to examine the plan-view as well as the side-view cross-sections to note the location and function of each element as it is discussed. A fixed base (60) can be a region that is rigid and integral, which may consist of a number of semiconductor, metallic, or dielectric elements that are fixed together to provide mechanical strength to the contacting device. A fixed base (60) further comprises an anchor region (50) and, as shown in FIG. 2B, may further comprise a substrate connection (62) and cover substrate (61). All of these elements may consist of one or more microfabrication-capable dielectric or semiconductor materials such as glass, polyimide or other polymer, alumina, quartz, gallium arsenide, or silicon. The base substrate in this variation can be polished silicon, 500 μm thick and 1 mm in each planar dimension, providing for a rigid base of microfabrication-quality material that is sufficiently large to permit ease of automated manufacture, packaging, and system insertion.

Attached to this fixed base (60) are a base contact element (35), a base actuator element (45), and a base slider element (15), that represent the physical surfaces that may be contacted in the actuation or operation of the contacting device. In some implementations, the base actuator element (45) and base contact element (35) will be electrical paths. The base actuator element (45) may be one of the electrical leads upon which a drive signal to actuate the device can be imposed. The base contact element (35) may be used as one electrode for a load signal path that is shown initially open and unconnected to other electrodes.

In the device illustrated by FIGS. 1 and 2A, the base contact element (35), base actuator element (45), and base slider element (15) can be manufactured of a combination of copper and gold alloy layers that are a total average thickness of 1 μm for low relay electrical resistance, and have a combination of titanium and tungsten adhesion layers approximately 0.1 μm thick. Such a metallization can be sufficiently thick and of low resistivity to permit low-loss lines for light to moderate load signals, and the thin adhesion layers will not considerably interfere with the electrical performance of the copper and gold alloys. A top gold alloy surface may be important for device packaging processes, such as wire bonding, flip-chip attachment, or substrate wafer-scale sealing, and will present improved reliability characteristics relative to a top surface comprised of non-noble metals.

In one application, one set of materials that can be used for any contacting surface, or electrical path, line, armature, or electrode element can be a set of conductive materials, also called conductors. Conductors used to manufacture relay elements may be selected from those materials having a low resistivity, defined as having a resistivity equal to or less than 0.2 Ohm-centimeter, equivalent to that of a heavily doped semiconductor. In some devices, materials that can be used include metals such as gold, copper, silver, platinum, nickel, tungsten, chromium, or aluminum. In other devices, materials that can be used include doped semiconductors such as silicon, gallium arsenide, gallium nitride, silicon germanium, aluminum gallium arsenide, and indium phosphide. Any alloy or combination of metals or semiconductors with an overall low resistivity can also be employed in some implementations.

The material thicknesses for contacting surfaces or electrical paths in devices can range from 0.1 to 500 µm, depending on the application and available manufacturing techniques. The thickness of one surface or path in one device can differ substantially from the thickness of a second surface or path in the same device due to differing electrical and manufacturing requirements. Electrical resistance of any path is related to its resistivity, its thickness, its width, and its total length. As a result, power savings can be obtained by selecting materials and geometries in a way as to reduce path resistance. This is particularly important for contacting devices that are designed to switch signal loads of high and very high powers. Use of materials that have a high resistivity and small width and thickness can result in Joule's Heating of switching elements that may be used to carry electrical current as a signal load, and could therefore increase load signal or control signal loss within the device.

The relationship between desirable material thicknesses and applications can be made; the ranges provided assume electrical paths are fabricated of conductive materials as previously defined. The material thickness of a path can range between 0.05 and 5 µm for a device intended for use with low signal loads and fast switching times. Such a path would be light, thin, and of higher resistance as compared to thicker paths of the same width and material, and considered useful in applications switching low or very low load signal powers. In applications with moderate signal loads and switching times, the material thickness of an electrical path can range between 0.5 and 50 µm, depending on the resistivity and width of the path. In applications demanding high load signal switching, the material thickness of a path could range between 5 and 500 µm. Such a path would be of higher mass and lower resistance as compared to thinner paths of the same width and material. In some devices, the materials of the contact elements and conductive paths can be made of similar materials and thicknesses for simplified manufacturing. In other devices, the armature contact elements are of a different material and thickness than other elements in order to improve mechanical and/or electrical properties of the contact itself. In some devices, all of the planar elements can be of different and varying materials and thicknesses for reasons related to improved performance or ease of fabrication.

In some devices, the physical geometry, material properties, and electrical properties of the armatures themselves can be carefully considered. In the device illustrated in FIGS. 1 and 2A, a primary actuator armature (40) is suspended from an anchor region (50) with one region fixed and the other free to deflect though mechanically coupled to additional elements. In some devices, armatures are constructed of one or more layers of microfabrication-capable materials such as silicon, silicon dioxide, silicon nitride, gallium arsenide, quartz, polyimide or other polymer, or a metal. The actuator armature can contain a layer of silicon dioxide 2 µm thick, selected for ease of microfabrication by sputtering, chemical vapor deposition, or spin-on glass techniques, and to provide an insulating rigid armature structure, and has metal on both top and bottom surfaces for enhanced manufacturing and temperature tolerance.

The vertical stiffness of a cantilever beam can be approximately linear with the width of the beam, related to a third-order degree with respect to thickness, and to an inverse third-order degree with respect to length. As a result, the thickness and length are of greater design importance than width for a beam that is expected to deflect in a vertical direction normal to the substrate. The overall thickness of such an armature can range from 0.1 µm to 1 mm, depending on the application, the length, and the fabrication technology used in manufacture. An armature in such a device could have a length between 5 µm and 5 mm. The actuator armature could be 40 µm wide and 180 µm long, providing sufficient width for mechanical rigidity and sufficient length for flexibility to the armature.

In devices for very low to low signal loads with very fast to fast switching speed, that an armature can range from 0.1 to 4 µm in thickness and between 3 and 50 µm in length. In a device designed for low to moderate signal loads with fast to moderate switching speed, it is considered that an armature can range from 1 to 50 µm in thickness, and between 15 and 800 µm in length. In an application requiring moderate to high signal loads with moderate to slow switching speed, an armature thickness can range from 10 to 500 µm in thickness and between 50 µm and 2 mm in length. In a device designed for high to very high signal loads and slow to very slow switching speeds, the armature can be between 100 µm and 1 mm in thickness and between 0.5 and 5 mm in length.

The discussed armature size ranges can apply not only to armatures and other elements of solid rectangular design, but also to armatures or other elements that vary in one or more dimensions by a linear or non-linear function. An example of such an armature would be a load armature that tapers from one width to a smaller width at the free end; it is recognized that such a structure may be of interest in RF applications as it can reduce input reflections and provide a higher performance than might a rectangular load signal armature.

Suspended from the primary actuator armature (40) can be an armature actuator element (41), which in the case of this variation can be an electrostatic actuation electrode. When a voltage is applied between the armature actuator element (41) and the base actuator element (45), the actuator is active and forces will be applied to the device. Also suspended from the primary actuator armature (40) can be an armature contact region (30), at the bottom of which can be an armature contact element (31), which is positioned appropriately relative to the base contact element (35) such that contact is intended to occur between the two elements when the armature is sufficiently deflected due to actuation or external stimulus during operation.

The size of the armature contact element (31) and base contact element (35) in devices according to this subject matter described herein may be between 0.5 mm$^2$ and 2 mm$^2$ in overall area. The specific area shape can be a square, a circle, an oval, or some non-standard geometric figure. In devices that might be used in applications of very low or low signal loads, these contact elements may be between 0.25 and 100 µm$^2$ in area, with a total area spread across a plurality of armature contact elements (31) and base contact elements (35). In devices more suitable for low or moderate signal loads, the contact elements might be between 20 and 3,000 µm$^2$ in area, also contemplating a plurality of elements. In devices suitable for handling high or very high signal loads, the contact elements can be between 1,000 µm^2 and 2 mm^2 in total area across, for example, a plurality of contact elements.

The performance demands of the armature contact elements (31) and base contact elements (35) may require the use of different material layers to provide improved mechanical wear properties over those of the other electrical path materials used in a device according this subject matter described herein. In some variations, such different layers could include layers of hard metals such as nickel, tungsten, rhenium, rhodium, ruthenium, and their oxides and alloys, either below or on top of the nominal contact element surface. Alloys or layered combinations of these and other low-resistivity metals can be used to fabricate the contact elements. In some devices, each material used for contact elements can have a thickness suitable for the application, which is likely to range from 0.01 to 100 µm. The thickness of contact elements can vary across its planar area, to provide for differences in element depth and shape for a given application.

The material thickness of armature contact elements (31) and base contact elements (35) suitable for zero, very low, or low signal load applications may range between 0.01 and 2 µm. Such contact elements can be light, thin, and of higher resistance than thicker paths of the same material and planar geometry. In a device suitable for low to moderate signal loads, the material thickness of contact elements can range between 0.5 and 10 µm, and would be of moderate mass and resistance as compared to other possible elements and paths of the same material. In other devices that may switch high or very high load signal powers, the material thickness of a contact element can range between 5 and 100 µm, and would be of high mass and low resistance as compared to thinner elements of the same material. In the variations illustrated in FIGS. 3A through 3E, the contact elements are of a gold alloy, with the addition of a curved 0.5 µm rhenium layer to provide a wear-resistant contact for long-lifetime.

Suspended from the armature contact element (31) is the asymmetric spring constant mechanism that is shown as an armature slider beam (20) and an armature slider region (10). Beneath the armature slider region (10) can be attached an armature slider element (11). The armature slider element (11) can be positioned appropriately relative to the base slider element (15) such that contact is intended to occur between the two elements when the armature is sufficiently deflected due to actuation or external stimulus during operation. It is the contact between the armature slider element (11) and the base slider element (15) that initiates the change in the spring constant of the armature system.

In some devices, materials used for the armature slider element (11), armature slider beam (20), and armature slider region (10) can include microfabrication-compatible conducting or insulating materials. Insulating materials include, but are not limited to, silicon, silicon nitride, silicon dioxide, quartz, diamond, ceramic, liquid crystal polymer, polyimide, or other insulating polymer. Conducting materials that can be used include layers of gold, platinum, aluminum, copper, nickel, tungsten, rhenium, rhodium, ruthenium, and their oxides and alloys. Alloys or layered combinations of these and other materials can be used to fabricate the armature contact region, armature slider beam, and armature slider region.

Material used for a contact armature may range from 0.1 µm to 1 mm thick dependent on material, armature geometry, and the application of the relay. In devices designed for very low or low signal loads, the material thickness of a contact armature could range between 0.1 and 8 µm. In devices designed for applications of low to moderate signal loads, the material thickness can range between 4 and 80 µm. In devices to be used in applications demanding stiff and thick contact armatures, such as for moderate to high signal loads, the material thickness could range between 50 and 300 µm. In yet other devices with large planar dimensions and designed for applications of high to very high signal loads, the material thickness could range between 100 µm and 1 mm.

The planar dimensions of the armature slider element (11), armature slider beam (20), and armature slider region (10) can be comparable or smaller in magnitude than those of the primary actuator armature (40). Such planar dimensions can range between 2 µm and 5 mm in each of width and length depending on the application, the material thickness, and the required contact force for the contacting device in each of its closed states. In devices in which very low to low signal loads are to be switched with fast switching speeds, the planar dimensions might range between 1 and 30 µm. In devices where low to moderate signal loads are to be switched, it is envisioned that the planar dimensions could range between 10 and 200 µm. In devices for applications of switching moderate to high signal loads at slow speeds, planar dimensions could range between 50 µm and 1 mm. In the larger devices switching high or very high signal loads at slow to very slow speeds, the planar dimensions might range between 200 µm and 5 mm. As with the primary actuator armature (40), it is envisioned that such ranges not only apply to elements of solid rectangular design, but also to elements that vary in one or more dimensions by linear or non-linear functions.

Figure 3A:
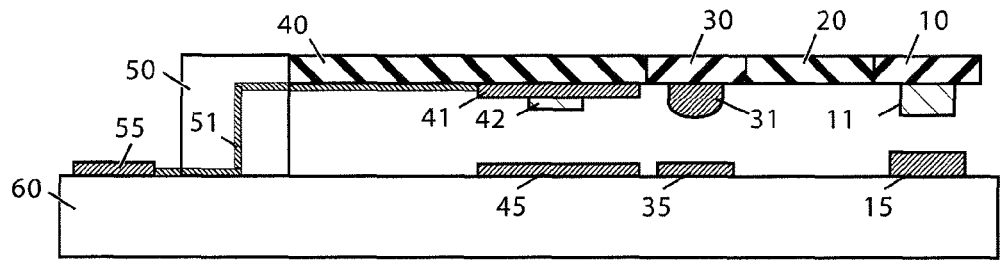
FIGS. 3A, 3B, 3C, 3D, and 3E are a series of side-view cross-sectional schematics that illustrate the curvature and forces acting upon the armature structures of FIGS. 1 and 2A during the process of actuation (towards making contact) and restoration (contact to be opened).

FIGS. 3A through 3E show a more complex example of the device of FIG. 2A. FIG. 3A is a device incorporating a more complex primary armature system. The additions relative to the device of FIG. 2A are the incorporation of an electrostatic actuation mechanism that is typical of many contacting devices in the industry. The device can be otherwise identical in architecture to the device of FIG. 2A, and serves as an instructive example of how these intended functions are performed when employed in an electrostatically-actuated contacting device.

The additional elements of FIG. 3A can be associated with the actuation electrodes of an electrostatically actuated device. The armature actuator element (41) serves as a first electrode of an electrostatic actuator, and the base actuator element (45) serves as a second electrode, together considered the actuator electrodes. The armature actuator element (41) can be electrically connected by way of an actuator electrode path (51) to an actuator electrode pad (55) used to make electrical contact to the armature actuator element (41). This variation can also feature an attached actuator insulator (42) that can be responsible for maintaining electrical separation between the armature actuator element (41) and the base actuator element (45). The actuator insulator (42) can also be physically connected to the primary actuator armature (40), fixed base (60), or armature actuator element (41) with little difference in equivalent functionality.

As with other electrical paths, conductors may be used to fabricate the armature actuator element (41), base actuator element (45), actuator electrode pad (55), and actuator electrode path (51). Material thicknesses of these elements can range between 0.1 to 100 µm, depending on the application and material as previously discussed. The planar area of the actuator electrodes can be between 25 µm^2 and 25 mm^2. For some devices, the planar area of the actuator electrodes will be a value comprising at least one half of the planar area of the primary armatures upon which they are positioned. The area shapes of the actuator electrodes can comprise squares, rectangles, circles, or some combination of geometric figures In devices with very small overall size, such as those handling very low signal loads with very fast switching speeds, the actuator electrodes may each be between 25 and 500 µm^2 in planar area. In devices with small overall size, such as those handling low signal loads with fast switching speeds, the actuator electrodes may each be between 300 and 50,000 µm^2 in planar area. Such devices can have moderate size, the actuator electrodes would each range between 30,000 µm^2 and 2 mm^2 in planar area. If a particular device requires large areas to generation electrostatic latching signals on the order of 1 mN or greater, the actuator electrodes can range from 1 to 25 mm^2 in area.

Low resistance conductors are not generally necessary for an electrostatic capacitive electrode such as one of the actuator electrodes. No appreciable DC current is needed to develop or dissipate a voltage across capacitive electrodes. By eliminating thick metal where it is not needed, the overall size and weight of the contacting device can be reduced to improve switching speed. Each of the actuator elements of the presently discussed variation are 10,000 µm^2 in rectangular area, and these elements as well as the latch and control signal lines are fabricated from gold and adhesion layers a total of approximately 0.5 µm thick.

The geometry of the actuator elements, contact elements, paths, and pads need not be restricted to the specific configurations illustrated. In some devices, armature elements can be affixed to the top, bottom, or traverse the center of the armature structure. In some devices, conductive paths could represent a majority of the material of the armature, unlike the depiction of FIGS. 2A, 2B, and 3A through 3E, which suggests the conductor can be less substantial than other armature materials. Conversely, in other devices, the mechanical properties of the armature conductor may not dominate the mechanical properties of the armature structure. Such a design may be desired as it is recognized that some conductive materials are subject to disagreeable long-term mechanical degradation. Similarly, the armature contact elements need not be restricted to flat geometric shapes, and can include curved or surface-roughened shapes.

An actuator insulator (42) can be used to prevent electrical contact from occurring between the actuator electrodes should the armature be deflected to the point of allowing physical contact. As the control signal is a differential voltage between the actuator electrodes, electrical contact can result in the shorting of this signal, a potentially destructive event. Each actuator insulator (42) would be fabricated of insulating materials, where an insulating material is defined as a material with a resistivity at or above 10 Ohm-centimeters. Such electrode insulators can consist of a plurality of dimples of silicon dioxide that each protrude through holes in the conductor layers of the armature actuator element (41) to 0.5 µm below the bottom surface.

In some devices insulating materials that may be used for an actuator insulator (42) could include insulating microfabrication materials such as undoped semiconducting materials, silicon nitride, silicon dioxide, quartz, diamond, sapphire, ceramic, polyimide, liquid crystal polymer, or other insulating polymer. The material used for an actuator insulator (42) can be thin relative to other material layers used in a device, for example, 0.05 to 5 µm thick. The material thickness of an actuator insulator (42) in some devices having very low to moderate actuator sizes could range between 0.05 and 0.8 µm. Such a range might be desired in an application where thin layers of insulating materials are available and are of sufficient quality to prevent a breaking down of the dielectric due to electric field strength. In some devices having moderate to very large actuator sizes, and where thin layers of high-quality insulating materials are unavailable, the thickness of an actuator insulator (42) could be between 0.2 and 5 µm.

The actuator insulator (42) can be placed in several different locations depending on the desired implementation. For example, the actuator insulator 42) can be affixed to the bottom surface of the armature actuator element (41), it can be affixed to the upper surface of the fixed base (60), it can be affixed to the upper surface of the base actuator element (45), and so on. In other devices, one or more actuator insulators (42) could be suspended between the actuator electrodes and mechanically attached to the fixed base (60) or armature structures at its edges. The electrodes and insulator need not be a continuous film like a membrane, but may be in a hole, line, grid pattern, or plurality of physically varying objects in different devices, provided they are mechanically coupled to either the primary actuator armature (40) or the fixed base (60) and provide the electrically insulating function as previously described.

The first stable operational state of the contacting device shown in FIGS. 3A through 3E, is defined as the passive state, which is the condition of the relay when no control signals are applied to the device. This is considered to be a natural condition, with device stability defined by the mechanical geometry and fabrication details of a given relay. FIGS. 2A, 2B, 3A, 5, and 7A provide typical examples of armatures in a passive state for some devices. In these examples, the relay contact elements are not engaged, the primary actuator armature (40) is in a nominally neutral state of stress equilibrium, and all electrodes are separated. In other devices, the primary actuator armature (40) or armature contact region (30) can be upwardly curled rather than nominally flat when in the passive state. In yet other devices, the primary actuator armature (40) or armature contact region (30) can be downwardly curled rather than nominally flat when in the passive state.

Figure 3B:
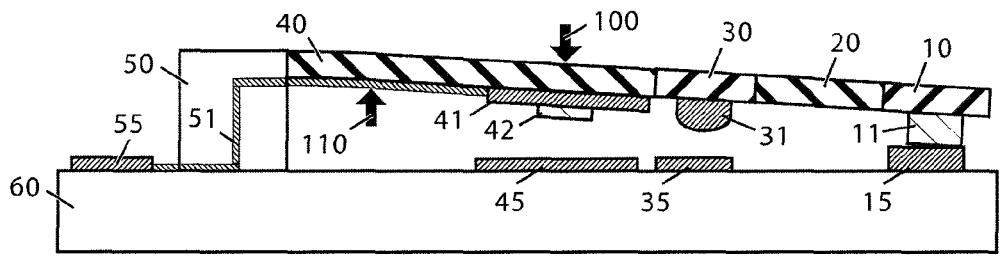

Electrical access to the two electrostatic actuator electrodes (the armature actuator element (41) and base actuator element (45)) can be provided by the actuator electrode pad (55) as well as by some method to the base actuator element (45). When a voltage difference (electrostatic potential) is established between the armature actuator element (41) and the base actuator element (45), the two electrodes will be attracted to each other according to electrostatic theory and practice. One step in this process of attraction is shown in FIG. 3B. The first armature deflection force (100) is shown as a thick black arrow, representing the force field that is generated between the two actuator elements. The base actuator element (45) can be considered to be in a fixed reference frame, being mechanically attached to the fixed base (60), so no arrow is shown operating on the fixed base (60) or any base elements, and the first armature deflection force (100) represents the combination of force fields. The armature actuator element (41), being attached to the primary actuator armature (40), will be attracted towards the base actuator element (45), and the entire armature system will begin to deflect downward. This downward deflection will result in the generation of stored potential energy in the deflected primary actuator armature (40), and an internal propensity to restore the armature (i.e., spring restoring force) to the lower potential energy state of the undeflected condition is shown schematically as a first primary armature restoring force (110). The downward deflection of the entire armature system will continue as illustrated in FIG. 3B until such a point of operation that the armature slider element (11) contacts the base slider element (15).

Figure 3C:
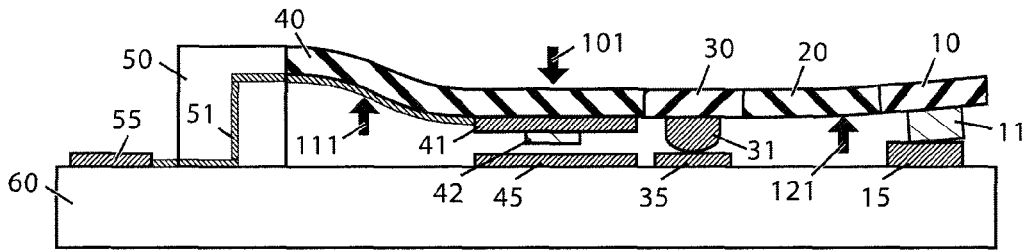

As the device continues to actuate, the responses of the various elements begins to change as illustrated in FIG. 3C. The force field generated by the actuator is now represented by a second armature deflection force (101) shown as a thick black arrow. In such an implementation, the actuator can be electrostatic, which increases the magnitude of generated forces as the armature actuator element (41) and base actuator element (45) are physically closer together. This means that the second armature deflection force (101) is larger than the first armature deflection force (100) in this particular device. The asymmetric nature of the entire armature system now takes effect. The primary actuator armature (40) stores potential energy due to the deflection of the armature system, which generates a spring restoring force shown schematically as a second primary armature restoring force (111). In addition, the armature slider beam (20) now also stores potential energy due to the deflection of the armature system, and this deflection generates a spring restoring force shown schematically as a first slider armature restoring force (121). With devices using an electrostatic actuator, the armature deflection and restoring forces continue to increase in magnitude as the device continues to actuate, and will reach a point where the armature contact element (31) makes physical and electrical contact with the base contact element (35). Throughout the process of deflection, it is important to note that the armature slider element (11) and the base slider element (15) are allowed to slide and rotate with the additional effects of friction and tribological phenomena normally associated with sliding surfaces.

Figure 3D:
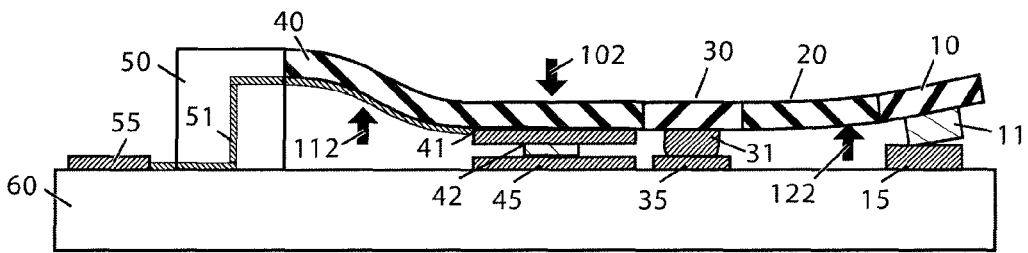

As the device continues to actuate towards an equilibrium condition, the responses of the various elements continues to change as illustrated in FIG. 3D. The force field generated by the actuator is now represented by a third armature deflection force (102). The primary actuator armature (40) deflection generates a spring restoring force shown as a third primary armature restoring force (112). Similarly, the armature slider beam (20) generates a spring restoring force shown as a second slider armature restoring force (122). In addition, the armature contact element (31) has continued to make physical and electrical contact with the base contact element (35), with some deformation illustrated schematically. A normal restoring force due to this pressure is not illustrated. This continues to the point of equilibrium in FIG. 3D, such that the third armature deflection force (102) is equal in magnitude and generally opposing the sum of the third primary armature restoring force (112), second slider armature restoring force (122), and normal restoring force due to contact. FIG. 3D also illustrates additional physical, but not electrical, contact between the base actuator electrode (35) and the actuator insulator (42), but such contact is not necessarily present in other equilibrium conditions of the presently described variation with different actuator conditions, or in other variations with similar or different actuator conditions.

Figure 3E:
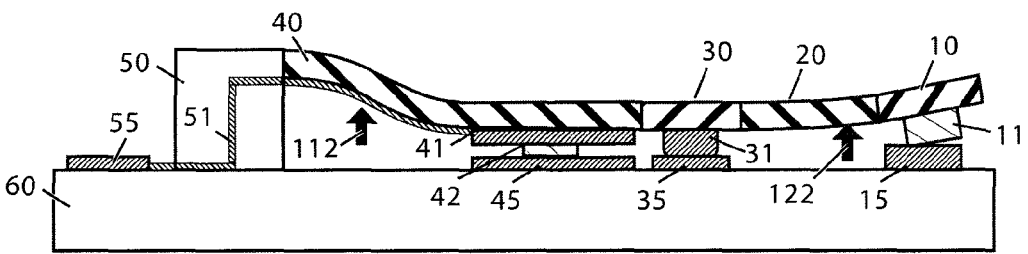

The benefits of the subject matter described herein are readily seen in the examination of the instant in time when the actuator forces are removed, as schematically illustrated in FIG. 3E. The force field generated by the actuator is now zero, as are the normal forces associated with the physical contact elements. What remains are the spring restoring forces of the primary actuator armature and the armature slider beam, which are the third primary armature restoring force (112) and second slider armature restoring force (122), respectively. Both of these forces now operate in a complementary fashion to repel the entire armature system and attached elements away from the fixed base (60), separating whatever physical contacts and adhesive forces that may be present between the armature contact element (31) and base contact element (35).

It is easy to contrast performance benefits, in that a simple armature system with only a primary actuator armature (40) providing potential energy storage as a spring restoring force would have only the third primary actuator restoring force (112) available to overcome adhesive forces present between the armature contact element (31) and base contact element (35). In this variation, it is clear that the additional force of the second slider armature restoring force (122) is also present, which can provide a critical advantage of operational reliability over devices that do not incorporate the advantages provided by the present devices.

Figure 4:
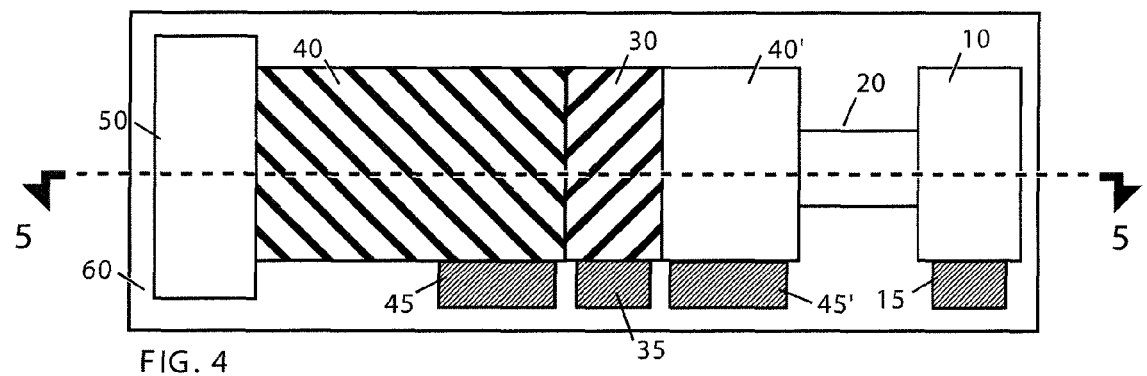
FIG. 4 is a plan-view schematic of a MEMS cantilever-based switching element architecture employing a system of sliders with an overall asymmetric spring constant
Figure 5:
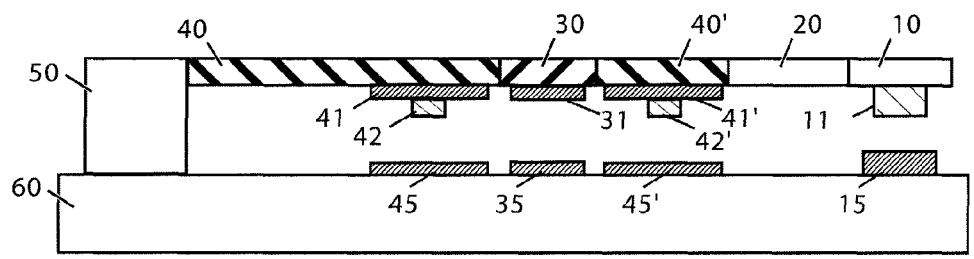
FIG. 5 is a side-view cross-sectional schematic of the switch shown in FIG. 4.

FIG. 4 illustrates a plan-view schematic of an alternative variation wherein multiple actuator elements are present, but no armature contact element (31) is present. Such a device might be valuable as a variable capacitor component suitable for tuning radio-frequency circuits, in that the device has a first capacitance value when the entire armature system is in the passive state as schematically illustrated in FIG. 5, and would have a second capacitance value when the entire armature system would be in a fully deflected equilibrium condition. In the normal operating conditions of this variation, the actuator contact element (31) would never make intimate physical and electrical contact with the base contact element (35). Instead, the electrical interaction would be provided by means of the change in capacitance, which is detectable with alternating current and radio-frequency signals.

The device of FIGS. 4 and 5 incorporates additional elements not previously described but similar in purpose to elements already discussed in previous devices. The analogous added elements are given numbers with prime designators for the purpose of clarity to the reader. In addition to the primary actuator armature (40) and armature actuator element (41), there is a second actuator armature (40') and second armature actuator element (41'), respectively, that are also suspended above the associated base actuator element (45) and second base actuator element (45') with electrical insulation provided by an actuator insulator (42) and second actuator insulator (42'). The functions of these elements are analogous to the similarly named elements of the variation described by FIGS. 3A through 3E.

The device of FIGS. 4 and 5 is made of a combination of materials that are similar in scope and type to those already discussed in previous variations. The entire armature system from the anchor region (50) to the end of the armature slider beam (20) is approximately 300 µm long, and is fabricated from a combination of silicon dioxide, gold, and adhesion metals that is a total of approximately 3 µm thick. The fixed base (60) is a highly resistive silicon material with a coating of silicon dioxide. Each of the actuator elements are 5,000 µm^2 in rectangular area, and these elements are fabricated from gold and adhesion metal layers a total of approximately 0.5 µm thick. The actuator insulator elements (42, 42') can be comprised of a series of cylindrical structures protruding through to 0.5 µm below the armature actuator elements (41, 41'), where each cylindrical protrusion is approximately 5 µm in diameter and fabricated from silicon dioxide. The armature slider element (11) itself is approximately 1,000 µm^2 in rectangular area, and protrudes 1.5 µm below the surface of the armature slider region (10). In operation, it would make contact and slide along the top surface of the base slider element (15), which has a larger area and is fabricated from gold and adhesion metal layers a total of approximately 0.5 µm thick. In this variation, a silicon-dioxide to gold sliding surface is used because these materials have many desirable tribological properties, such as low wear rates and low coefficients of friction.

Figure 6:
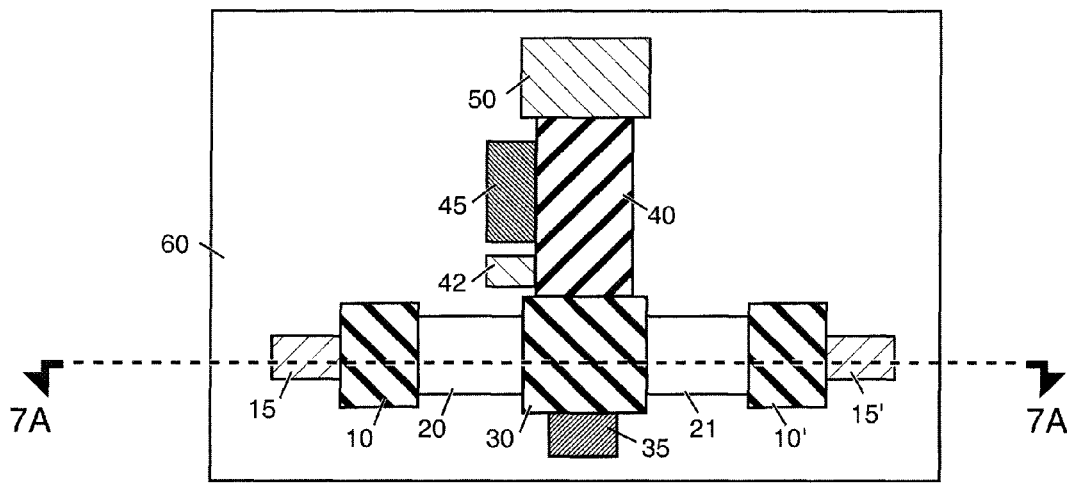
FIG. 6 is a plan-view schematic of a MEMS cantilever-based switching element architecture employing multiple separate sliders with asymmetric spring constants.

FIG. 6 is a functional plan-view schematic of another general class of devices having a plurality of slider armatures and slider elements. FIG. 6 is a true plan-view schematic, as elements on the lower surface of the armature are not depicted until viewed with the cross-sectional schematics of FIGS. 7A, 7B, and 7C. However, elements that are on the fixed base are shown with part of each element protruding so as to be visible and identifiable for the sake of clarity. As before, objects are shown with consistent cross-hatching even in plan-view for ease of reference and element identification.

In the variations illustrated by FIG. 6, a cantilever armature system is fixed at a common end and free to deflect at the opposing end in a similar manner as the device illustrated in FIG. 1, where a primary actuator armature (40) provides initial spring characteristics. Attached to the primary actuator armature (40) is an armature contact region (30) with an armature slider beam (20) with an armature slider region (10), as well as a second armature slider beam (20') and second armature slider region (10'). In these variations, the actuator insulator (42) is shown attached to the fixed base (60) and protruding from beneath the primary actuator armature (40). Also attached to the fixed base (60) are the base slider element (15) and second base slider element (15'), shown protruding from the regions directly underneath the two suspended armature slider regions.

In one implementation, the fixed base (60) is manufactured of polished alumina, with planar dimensions approximately 1 mm^2 and thickness 250 µm. The anchor region (50), primary actuator armature (40), contact element region (30), and both armature slider beams (20, 20') and armature slider regions (10, 10') are all fabricated from a gold alloy that is approximately 1.8 µm thick. The primary armature actuator (40) is approximately 40 µm wide and 180 µm long, attached to an anchor region (50) the same width and 30 µm long. The contact element region (30) is approximately 40 µm wide and 20 µm long with a shape that reduces capacitance between the contact element region (30) and the lower base contact element (35). The base contact element (35) is small in planar size to reduce capacitance to the contact element region (30), and is fabricated from a combination of conducting materials approximately 1 µm thick. Both the anchor region (50) and base contact elements (35) would ultimately connect to larger and thicker output signal paths that are not shown.

In other variations, the actuator insulator (42) is a plurality of objects positioned in a way that prevents electrical contact between the base actuator element (45) and the armature actuator element (41). The actuator insulator (42) is a total of 300 µm^2 in planar area, and is fabricated from a combination of conducting and insulating materials approximately 1.5 µm thick with a top surface that is insulating alumina. The base actuator element (45) is a total of approximately 4,000 µm^2 in area, and is fabricated from a combination of conducting materials approximately 1 µm thick with a top surface that is gold.

Figure 7A:
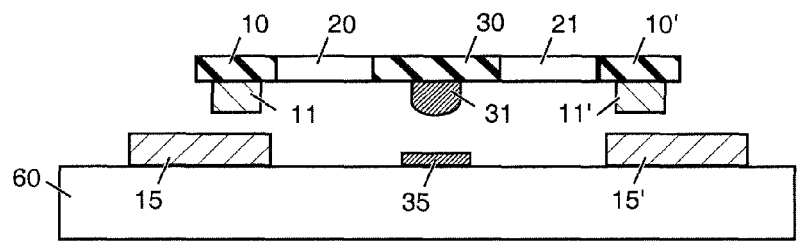
FIGS. 7A, 7B, and 7C are side-view cross-sectional schematics illustrating the forces acting upon variations of the subject matter described herein described in FIG. 6 during the process of actuation

A cross-sectional schematic of the actuation mechanism of the device is not provided for the sake of brevity, as the operation of the subject matter described herein is instead shown in a cross-sectional schematic of the pair of armature slider beams (20) near the free end of the entire armature system. FIG. 7A illustrates the cross-section in this region when the actuator is in a passive state at equilibrium or at rest. In this variation, the resting state is shown with a flat and undeflected beam that is parallel to the fixed base. It is recognized that the resting state of other devices can have an upward or downward curvature of the primary actuator armature (40) and/or the armature slider beams (20).

Additional elements can be seen in the side view of FIG. 7A, which are the armature contact element (31), armature slider element (11), and second armature slider element (11'). The armature contact element (31) operates in the same manner as discussed in the variations illustrated in 7A through 7E. The slider elements (11, 11') operate in a similar manner, with the details of forces and sliding operation illustrated schematically in FIGS. 7B and 7C.

Figure 7B:
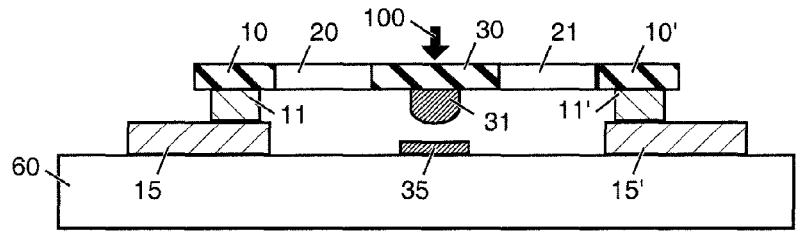

FIG. 7B illustrates the first step in the process of actuating the device, whereby a first armature deflection force (100) is shown, representing the force field that is driving the armature contact region downward towards the fixed base. This downward deflection will result in the generation of stored potential energy in the deflected primary actuator armature (40), and a spring restoring force as a first primary armature restoring force (110) not shown in this cross-sectional schematic, as the primary actuator armature (40) is not visible. The downward deflection of the entire armature system is shown in FIG. 3B to reach a point where both armature slider elements (11, 11') contact their respective base slider elements (15, 15').

Figure 7C:
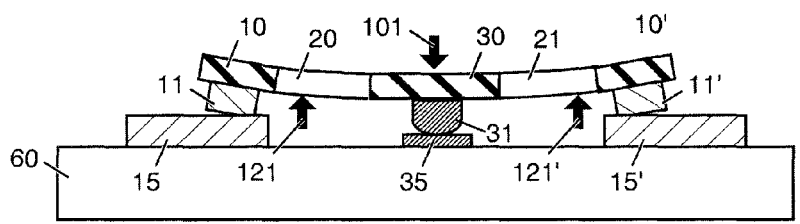

As the device continues to actuate, the responses of the various elements begins to change as illustrated in FIG. 7C. The force field generated by the actuator is now represented by the second armature deflection force (101), and the asymmetric nature of the entire armature system now takes effect. The primary actuator armature generates a second primary armature restoring force (101) not shown, and the armature slider beams (20, 20') also stores potential energy due to the deflection of the armature system. This is shown schematically as a first slider armature restoring force (121) and a first complementary slider armature restoring force (121'). As with previously described variations of this subject matter described herein, it is important to note that the armature slider element (11) and the base slider element (15) are allowed to slide and rotate with the additional effects of friction and tribological phenomena normally associated with sliding surfaces.

It is evident by extrapolation of the operation of the devices of FIGS. 3A through 3E that these devices will result in the augmentation of restoring force by the sum of the slider armature restoring forces. This enables even strong adhesion forces to be overcome provided the restoring forces and springs are engineered appropriately for the operational characteristics of the actuator and the device contacts. When properly implemented, a system of additional slider beams can provide significant benefit to the operational reliability of miniature switching devices and tunable capacitors.

In some variations, the armature slider beam (20) and second armature slider beam (20') can be trapezoidal, approximately 40 µm wide where they attach to the armature contact region (30), and approximately 20 µm wide where they connect to the armature slider elements (11, 11') at the ends of their 40 µm length. The armature slider region (10) and second armature slider region (10') can be each 20 µm square in planar size. The armature slider element (11) and second armature slider element (11') can be fabricated out of the same material as the armature slider region (10) and second armature slider region (10'), essentially representing the bottom surface of those elements without an actual separate physical thickness. All of these elements can be fabricated out of a gold alloy material that is 1.8 µm thick.

In some variations, the armature contact element (31) can be a circular patch that is approximately 50 µm^2 in planar area, fabricated out of combination of conductive materials including platinum and adhesion metals a total of 0.2 µm thick. The base slider region (15) and second base slider region (15') are approximately 50 µm^2 in planar area, and fabricated out of a combination of conductive and insulating materials that are a total of 1.5 µm thick with a top surface that is insulating alumina.

Although a few variations have been described in detail above, other modifications are possible. For example, the logic flow depicted in the accompanying FIGs. and described herein do not require the particular order shown, or sequential order, to achieve desirable results. Other embodiments may be within the scope of the following claims.

What is claimed is:

1. A cantilever armature system comprising:
a base;
a primary actuator armature coupled to the base;
at least one spring element coupled to the primary actuator, the primary actuator armature and at least one spring element providing a first instantaneous spring constant in a first state in which at least one spring element does not contact the base, and a second instantaneous spring constant in a second state in which at least one spring element contacts the base; and
a base slider element mounted on a face of the base opposing the primary actuator and an armature element opposite the base slider element mounted on one of the spring elements so that the armature element contacts the base slider element when the spring element is deflected in a manner allowing rotation.

2. The system of claim 1, wherein the primary actuator armature is coupled to the base by an anchor region.

3. The system of claim 1, wherein the anchor region is coupled to a cover substrate, the cover substrate being connected to the base.

4. The system of claim 1 further comprising: a base contact element mounted on a face of the base opposing the primary actuator armature and an armature actuator element opposite the base contact element mounted on the primary actuator armature so that the armature contact element contacts the base contact element when the primary actuator armature is deflected.

5. The system of claim 1 further comprising: a base actuator element mounted on a face of the base opposing the primary actuator armature and an armature contact element opposite the base actuator element mounted on one of the spring elements so that the armature actuator element contacts the base contact element when one of the spring elements is deflected.

6. The system of claim 5 wherein one of the at least one spring elements comprises an armature contact region, and wherein the armature contact element is mounted to the armature contact region.

7. The system of claim 1 wherein one of the at least one spring elements comprises an armature slider region, and wherein the armature element is mounted to the armature slider region.

8. The system of claim 7, wherein the armature slider region is coupled to a armature slider beam, the armature slider beam being coupled to an armature contact region, the armature contact region being coupled to the primary actuator armature.

9. The system of claim 1, wherein the primary actuator and the at least one spring element are microfabricated.

10. A system comprising:
a base;
a primary actuator armature coupled to the base;
means for providing a first instantaneous spring constant in a first state in which at least one spring element does not contact the base, and a second instantaneous spring constant in a second state in which at least one spring element contacts the base; and
a base slider element mounted on a face of the base opposing the primary actuator and an armature element opposite the base slider element mounted on one of the spring elements so that the armature element contacts the base slider element when the spring element is deflected in a manner allowing rotation.

11. A system comprising:
a base;
a primary actuator armature coupled to the base;
at least one spring element coupled to the primary actuator, the primary actuator armature and at least one spring element providing a first instantaneous spring constant in a first state in which at least one spring element does not contact the base, and a second instantaneous spring constant in a second state in which at least one spring element contacts the base; and
sliding means mounted on a face of the base opposing the primary actuator and an armature element opposite the sliding means mounted on one of the spring elements so that the armature element contacts the sliding means when the spring element is deflected in a manner allowing rotation.

* * * * *